April 27, 1948. M. G. CROSBY Re. 22,996

DIFFERENTIAL DETECTOR CIRCUITS

Original Filed July 17, 1941 2 Sheets-Sheet 1

INVENTOR
Murray G. Crosby
BY H. S. Grover
ATTORNEY

DIFFERENTIAL DETECTOR CIRCUITS

Original Filed July 17, 1941 2 Sheets-Sheet 2

INVENTOR
Murray G. Crosby
BY H. S. Grover
ATTORNEY

Reissued Apr. 27, 1948 Re. 22,996

UNITED STATES PATENT OFFICE 22,996

DIFFERENTIAL DETECTOR CIRCUITS

Murray G. Crosby, Riverhead, N. Y., assignor to Radio Corporation of America, a corporation of Delaware Original No. 2,296,092, dated September 15, 1942, Serial No. 402,784, July 17, 1941. Application for reissue December 28, 1943, Serial No. 515,963

13 Claims. (Cl. 250—27)

Figure 1:
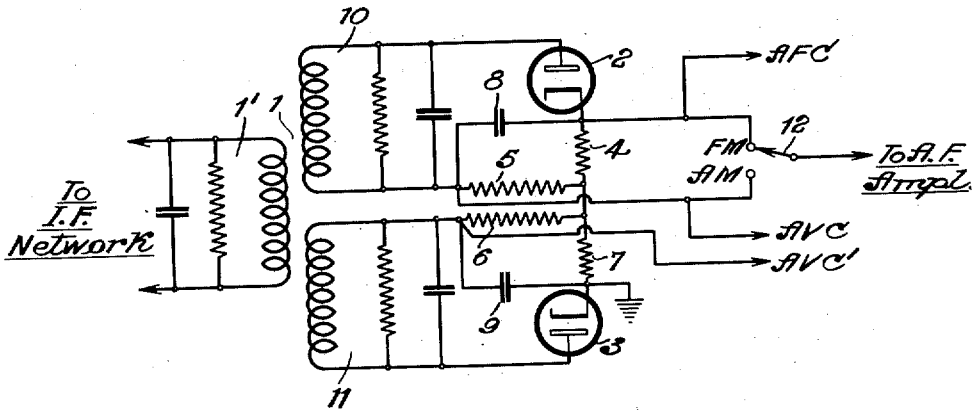

My present invention relates to differential diode detector circuits adapted for reception of frequency, or phase, modulated carrier waves or amplitude modulated carrier waves, and more particularly to such detector circuits which include means for readily switching from one type of reception to the other type.

In the past the differential detector circuit has been constructed to favor frequency modulated carrier wave (FM) reception, and for amplitude modulated carrier wave reception a separate detector was utilized, or a specific type of combining circuit was employed. Several methods have been employed to provide a detection circuit capable of utilization with either of the aforesaid types of reception. Some of these methods required the use of one or more coupling tubes, and usually had the disadvantage that the automatic frequency control (AFC) voltage appeared as a balanced-to-ground voltage instead of the more desirable potential against ground.

Accordingly, it may be stated that it is one of the main objects of this invention to provide a simple type of differential diode detector circuit which eliminates the necessity of using extra tubes and produces the desired type of AFC potential; and which can be utilized for either of FM or AM (amplitude modulated carrier wave) reception by the expedient of adjusting a simple switch mechanism.

Another important object of this invention is to provide a differential diode detector circuit which is so arranged that, when fed from a frequency discriminator network, terminals are available for detected AM voltage, FM voltage, automatic volume control (AVC) and AFC voltages, and these terminals being independent of each other so that amplitude and frequency modulated carrier waves may be detected simultaneously and AFC and AVC potentials be continuously available.

Still other objects of my invention are to improve generally the simplicity and efficiency of differential diode detector circuits, and more especially to provide differential detector circuits which are readily and economically assembled in radio receivers.

The novel features which I believe to be characteristic of my invention are set forth in particularity in the appended claims; the invention itself, however, as to both its organization and method of operation will best be understood by reference to the following description taken in connection with the drawings in which I have indicated diagrammatically several circuit organizations whereby my invention may be carried into effect.

Figure 2:
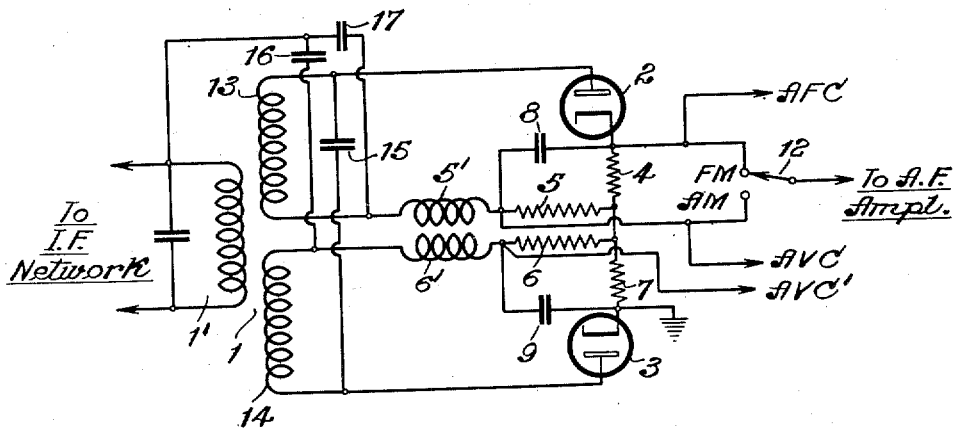
Figure 3:
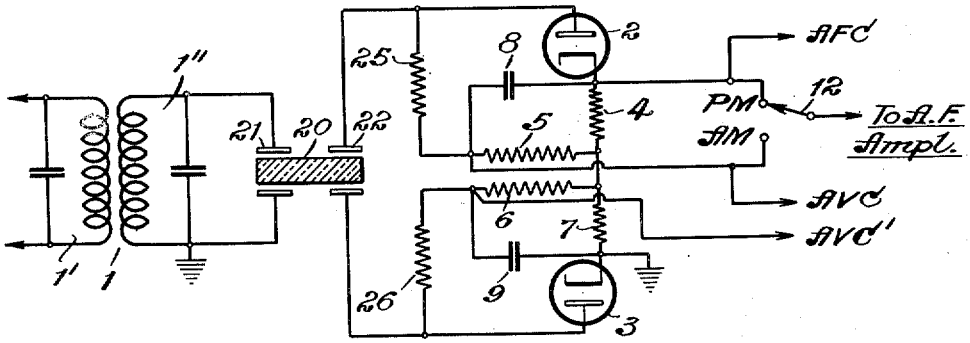
Figure 4:
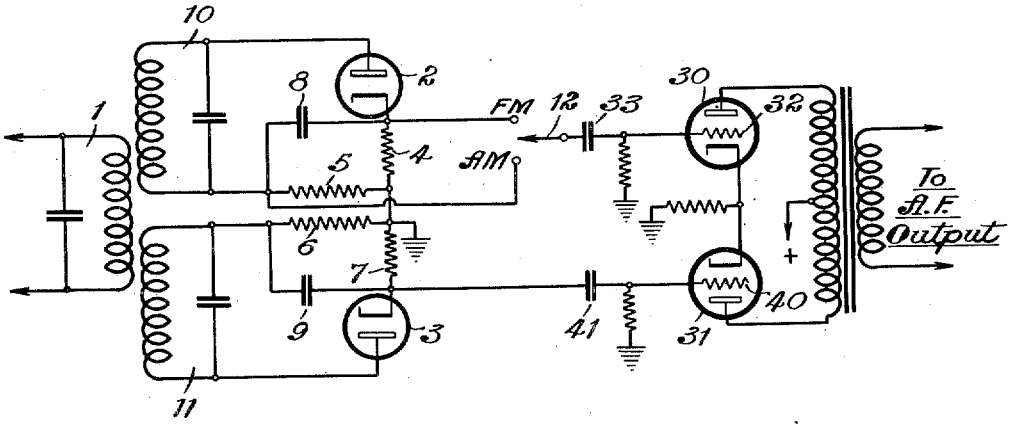
Figure 4A:
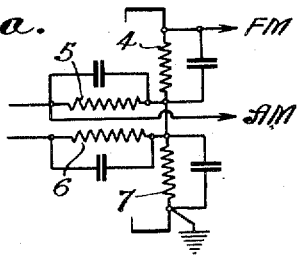

In the drawings:

Fig. 1 shows one arrangement embodying the invention,

Fig. 2 shows a modification of the embodiment of Fig. 1, a different type of discriminator network being employed, Fig. 3 shows a further modification wherein still another form of discriminator network is employed, Fig. 4 illustrates a further modification wherein the differential detector is used to drive a push-pull amplifier, Fig. 4a illustrates a modification of a portion of the differential detector circuit of Fig. 4.

Referring now to the accompanying drawings, wherein like reference characters in the different figures designate similar circuit elements, the circuit arrangment of Fig. 1 illustrates a differential diode detector circuit which may be utilized in a superheterodyne receiver of the type capable of receiving FM or AM waves. It is not believed necessary to describe the networks prior to the input transformer of the detector circuit, because those skilled in the art are fully acquainted with such receiver networks. It is believed sufficient to point out that in the case of FM reception, and assuming the FM reception to cover 42–50 megacycles (mc.), the receiver would utilize a converter network to reduce the selected FM waves to a lower frequency. The operating intermediate frequency (I. F.) may be of the order of 4.3 mc., and the I. F. waves would be amplified in several stages of I. F. amplification followed by any well known form of amplitude modulation limiter device. The pass band of the coupling networks would depend upon the center frequency deviation range, and, of course, the pass band of the various coupling networks would be sufficiently wide to pass the entire center frequency deviation range. Assuming that wide band FM waves are employed, it will be understood that a pass band of substantially 150 to 200 kilocycles (kc.) will be utilized in each of the coupling transformers.

Hence, the I. F. input transformer 1 is shown as comprising a primary resonant circuit 1' which is tuned to the center frequency of the applied FM waves, and this center frequency is, of course, the operating I. F. value. A damping resistor is shown shunted across the circuit to provide a sufficiently wide pass band for the FM waves. The transformer 1 is provided with a pair of secondary resonant circuits 10 and 11. Each of them is provided with a damping resistor to provide a sufficiently wide pass band. These secondary circuits 10 and 11 are mistuned with respect to the center frequency of the applied FM waves. The mistuning is in opposite senses, but in equal frequency amounts. Thus, tuned circuit 10 could be tuned to a certain number of kilocycles above the center frequency, while circuit 11 would be tuned the same number of kilocycles below the center frequency. This type of discriminator network is well known in the art, and it is not believed necessary to describe it in any further detail.

This type of discriminator converts applied FM waves to AM waves with modulation envelopes 180 degrees out of phase. These modulation envelopes are detected by diodes 2 and 3 which make the detected outputs available across resistors 4—5 and 6—7. Resistors 4 and 5 are arranged in series between the cathode of diode 2 and the low potential side of tuned circuit 10, the I. F. by-pass condenser 8 being connected in shunt across resistors 4—5. Simultaneously, resistors 7 and 6 are arranged in series relation between the cathode of diode 3 and the low potential side of tuned circuit 11, the I. F. by-pass condenser 9 shunting resistors 6—7. The junction of resistors 4 and 5 and the junction of resistors 6 and 7 are directly connected together, and the cathode end of resistor 7 is established at ground potential. The manner in which these resistors are connected together makes the detected FM voltage available across resistors 4 and 7.

That is to say, the FM voltage is taken off at the cathode end of resistor 4. Hence, the letters FM are applied to a terminal connected directly to the cathode end of resistor 4. It will be noted that the output of the two resistors 4 and 7 is reversed in phase so that the proper phase reversal is accomplished for the addition of the detected FM voltage. The slow variations of frequency, corresponding to carrier or local oscillator frequency drift rates, also appear across these resistors 4 and 7 which are available for AFC purposes. Therefore, the AFC connection is made to the FM voltage output lead. As is well known to those skilled in the art, the AFC bias may be employed to control the local oscillator of the receiver so as to vary its frequency in a sense to insure, or maintain, the correct value of I. F.

If the receiving system is used to receive AM waves, then it is merely necessary to connect an output terminal, designated AM, to the anode end of resistor 5. The AM voltage output is taken from across resistors 5 and 7. It will be noted that these two resistors 5 and 7 are connected so that they both have their ends which are towards the diode plates at high potential, and the combination of the detected AM voltage outputs is in phase. The normal adjustments of the resistors are to make them all equal in order to effect the balanced conditions for both AM and FM reception. It is to be noted that the by-pass condensers 8 and 9 will by-pass the I. F. currents fed to the discriminator, but allow the modulation frequencies to pass.

There are two points from which AVC potentials may be obtained. The first point is from the same point that the AM voltage output is obtained, and, hence, the letters AVC are applied to a lead connected to the AM voltage output lead. This point gives a potential corresponding to a summation of voltages from both detectors, since it is a summation of the voltages across resistors 7 and 5. The second point from which to derive AVC voltage is designated AVC′, and this output lead is connected to the anode end of resistor 6. This output point AVC′ gives a control potential corresponding to the voltage from one detector only, since it is the sum of the voltages across resistors 7 and 6 which are both in the same circuit with diode 3. The choice of which of these two points to use to obtain the AVC potential depends upon the exact nature of the discriminator which feeds the diodes. For most purposes there will be little difference between the types of AVC action obtained from the two points. Those skilled in the art are fully acquainted with the manner of using the AVC bias. It is only necessary to point out that the AVC bias is applied to the amplifiers prior to the differential detector so as to vary the gain of these amplifiers in a sense to compensate for carrier fading.

An adjustable switch element 12 is provided so as to select either FM or AM voltage depending upon the type of reception which is had. The adjustable element 12 is connected to the input electrode of the following audio frequency amplifier, and the element 12 may be adjusted to contact either the FM or AM output terminal of the differential detector. It is pointed out that when receiving AM waves with this system the AM waves will pass through the receiving system in the usual manner, it being only necessary that the carrier frequency of the AM waves be of a value equal to the tuned frequency of the primary resonant circuit 1′, or stated more generally, the carrier frequency of the AM should be located in the pass band of the transformer 1. Simultaneous derivation of detected FM and AM voltages could be taken off in such cases where the carrier at the transmitter is simultaneously frequency modulated by one type of signal and amplitude modulated by another type of signal. In such a case, of course, adjustable switch element 12 would be replaced by a pair of leads connected to the respective FM and AM output points.

When the common carrier is frequency and amplitude modulated a small degree of amplitude modulation (probably not over about 50 percent) would be used for the AM signals, and the carrier is frequency modulated in the normal manner. Another way of detecting this type of modulation would be to divide the signal into two branches one of which is a frequency modulation detector and the other an amplitude detector. With such separate branches, the FM detector may include a limiter to more completely remove the amplitude modulation, but with the system shown here, the balance of the detectors would be depended upon to cancel the amplitude modulation from the FM output. No limiter would be used prior to the detector in Fig. 1 for AM or simultaneous FM and AM reception.

In Fig. 2 the diodes 2 and 3 are shown connected to a different type of discriminator input circuit. The discriminator in this case is of the type disclosed by S. W. Seeley in U. S. Patent 2,121,103, granted June 21, 1938. The primary circuit is again tuned to the center frequency of the applied FM waves. Instead of using a single tuned secondary circuit, two secondaries 13 and 14 are employed, the condenser 15 shunting the secondaries and tuning them to the center frequency of the applied waves. The high potential side of circuit 1′ is connected by a direct current blocking condenser 16 to the cathode end of coil 14, while the direct current blocking condenser 17 connects the high potential side of circuit 1' to the cathode end of coil 13. Resistors 4 and 5 are again arranged in series between the cathode of diode 2 and the low potential end of coil 13, a choke coil 5' being connected in series with resistor 5.

The cathode end of resistor 7 is at ground potential and a choke coil 6' is in series with resistor 6. The resistors 7 and 6 are connected in series between the cathode diode 3 and the low potential end of coil 14. The two secondaries 13 and 14 are used in place of the usual mid-tapped secondary winding in order to isolate the rectified currents in the two resistors adjacent the chokes. It is not believed necessary to describe the manner in which the discriminator circuit operates in Fig. 2 to produce the detected FM voltage between the cathode end of resistor 4 and ground. It will be noted that the various output voltage connections are made to substantially the same point as in the case of Fig. 1.

In Fig. 3 there is shown an arrangement wherein the discriminator input circuit is of the type disclosed in my U. S. Patents 2,085,008, 2,156,374, and 2,312,079. While this detector is primarily a phase modulation (PM) detector, it will detect FM waves if the degree of modulation is low enough. In this type of circuit the transformer 1 has its primary circuit 1' and secondary circuit 1'' constructed and arranged so as to have a pass band equal to the channel width of the applied waves. Each of 1' and 1 is tuned substantially to the carrier frequency. A piezoelectric crystal 20, tuned to the center frequency of the applied FM waves, is arranged between two pairs of crystal electrodes 21 and 22 in well known manner. The pair of crystal electrodes 21 is connected to opposite ends of the secondary circuit 1'', while the second pair 22 is connected to the respective anodes of diodes 2 and 3. This provides a self-neutralized type of crystal holder in which the diodes are connected differentially, with one diode cathode being grounded.

It is not believed necessary for the purposes of this application to give a detailed description of the manner of operation of the discriminator, reference being made to my aforesaid patents and application for a detailed explanation, as well as to my paper "Communication by Phase Modulation" in Proceedings of I. R. E. for February, 1939. It is sufficient to point out that the crystal functions to rotate the phase of the vector resultant of the modulation side bands of the applied PM waves so that the resultant vector of the modulation side bands is in phase with the carrier. By means of this phase rotation action, the PM waves are converted to AM waves which are rectified by the differentially connected diode detectors. Specifically, resistors 4 and 5 are arranged in series with a resistor 25 between the anode and cathode of diode 2. Resistors 7 and 6 are arranged in series relation with resistor 26 between the anode and cathode of diode 3. Resistors 25 and 26 provide direct current circuits for the diodes, and, also, act to divide the crystal output into two portions. Here, again, the various output voltage connections are seen to be taken off at the same points as in the case of Figs. 1 and 2.

With this circuit the simultaneous reception of phase modulation and amplitude modulation is possible, and AFC bias is simultaneously produced. The usual procedure, however, is the alternative reception of phase or amplitude modulated waves by means of switch 12. Hence, it will be understood that the circuit arrangement in Fig. 3 is useful for receiving phase modulated or amplitude modulated carrier waves. The letters PM designate the detected phase modulated voltage output terminal, and it will be noted that the terminal is connected to the cathode end of resistor 4, as in the case of Figs. 1 and 2 where the FM output terminal is made to the same point. When FM waves are received by this circuit of Fig. 3, the S-shaped curve of Fig. 9 of my I. R. E. paper is depended upon for detection.

In Fig. 4 there is shown the arrangement of Fig. 1 constructed to drive a push-pull audio amplifier. There is shown the audio amplifier tubes 30 and 31 each having their signal input grids arranged for push-pull operation, and the plate circuits are arranged for push-pull operation as well. The signal grid 32 of tube 30 is connected through the audio coupling condenser 33 to the adjustable element 12 which may be adjusted to select either of the detected FM or AM voltage output terminals. The junction of resistors 4 and 7 is at ground potential, while the grid 40 of tube 31 is connected by the audio coupling condenser 41 to the cathode end of resistor 7.

It will be noted that the usual method of reversing the phase of combination when such a push-pull audio amplifier is used makes use of a reversing switch between one of the amplifier plates and the output transformer. This requires an output transformer with both plate windings separated instead of the mid-tapped type shown in Fig. 4. The prior arrangement, also, has the disadvantage that for the amplitude modulation connection the tubes are no longer connected in push-pull, so that the benefit of the direct current flux balance is not obtained. In the circuit arrangement of Fig. 4 it is possible to use a single-pole, double-throw switch to change from amplitude modulation to frequency modulation reception.

In the circuit of Fig. 4*a*, it is shown how the separate resistors 4—5 and 7—6 of the two diodes 2 and 3 may be by-passed individually. This type of by-passing sometimes is advantageous since all points of the resistors are then by-passed, and the mid-tap of the upper diode resistors is not left unby-passed by the presence of the lower diode resistors between the mid-tap and ground.

While I have indicated and described several systems for carrying my invention into effect, it will be apparent to one skilled in the art that my invention is by no means limited to the particular organizations shown and described, but that many modifications may be made without departing from the scope of my invention, as set forth in the appended claims.

What I claim is:

1. In combination, a first diode having a modulated carrier wave input circuit, a pair of resistor elements arranged in series relation between the cathode of said diode and one side of said input circuit, a second diode provided with a modulated carrier wave input circuit, a second pair of resistors arranged in series relation between the cathode of the second diode and one side of its input circuit, a direct current voltage connection between the junction of said first pair of resistors and said second pair of resistors, means for applying to said diode input circuits modulated carrier waves of variable center frequency or modulated carrier waves of constant carrier frequency and variable amplitude, like resistors of said two pairs of resistors being differentially connected to provide thereacross modulation voltage corresponding to the aforesaid center frequency variations, means for deriving said modulation from across said differentially connected resistors, and additional means connected to the anode end of one of said pair of resistors for deriving modulation voltage corresponding to said modulated waves of variable carrier amplitude.

2. In combination with a first diode having a modulated carrier wave input circuit and a pair of resistors arranged in series relation between the anode and cathode of the diode, a second diode having a modulated carrier wave input circuit and a second pair of resistors arranged in series relation between the anode and cathode of the second diode, means applying to said input circuits modulated carrier waves which are alternatively frequency or amplitude modulated, means establishing the cathode end of one of said pair of resistors at ground potential, means connecting in series relation between the cathodes of said diodes like resistors of said two pairs of resistors, means for connecting a detected frequency modulation voltage output terminal to the ungrounded cathode end of said pair of like resistors, and a separate detected amplitude modulation voltage terminal connected to the anode end of one of said pair of resistors.

3. In combination, a first diode having a frequency and amplitude modulated carrier wave input circuit, a pair of resistor elements arranged in series relation between the cathode of said diode and one side of said input circuit, a second diode provided with a modulated carrier wave input circuit, a second pair of resistors arranged in series relation between the cathode of the second diode and one side of its input circuit, a connection between the junction of said first pair of resistors and said second pair of resistors, like resistors of said two pairs of resistors being differentially connected to provide thereacross modulation voltage corresponding to center frequency variations of the modulated carrier waves, means for deriving said modulation from across said differentially connected resistors, and additional means connected to the anode end of one of said pair of resistors for deriving modulation voltage corresponding to amplitude variation of said modulated waves.

4. In combination with a first diode having a modulated carrier wave input circuit and a pair of resistors arranged in series relation between the anode and cathode of the diode, a second diode coupled to said modulated carrier wave input circuit, a second pair of resistors arranged in series relation between the anode and cathode of the second diode, means applying to said input circuit modulated carrier waves which are alternatively phase or amplitude modulated, means establishing the cathode end of one of said pair of resistors at ground potential, means connecting in series relation between the cathodes of said diodes like resistors of said two pair of resistors, means for connecting detected phase modulation voltage output terminal to the ungrounded cathode end of said pair of like resistors, and a separate detected amplitude modulation voltage terminal connected to the anode end of one of said pair of resistors.

5. In combination with a first diode having a modulated carrier wave input circuit and a pair of resistors arranged in series relation between the anode and cathode of the diode, a second diode having a modulated carrier wave input circuit, and a second pair of resistors arranged in series relation between the anode and cathode of the second diode, means applying to said input circuits modulated carrier waves which are alternatively frequency or amplitude modulated, means connecting in series relation between the cathodes of said diodes like resistors of said two pairs of resistors, means grounding the junction of said like resistors, means for connecting detected frequency modulation voltage output terminals to the ungrounded cathode ends of said pair of like resistors, and a separate detected amplitude modulation voltage terminal connected to the anode end of one of said pair of resistors.

6. In combination, a first diode having a modulated carrier wave input circuit, a pair of resistor elements arranged in series relation between the cathode of said diode and one side of said input circuit, a second diode provided with a modulated carrier wave input circuit, a second pair of resistors arranged in series relation between the cathode of the second diode and one side of its input circuit, a connection between the junctions of said first pair of resistors and said second pair of resistors, means for applying to the input circuit of each of said diodes modulated carrier waves, like resistors of said two pairs of resistors being differentially connected to provide thereacross a first modulation voltage corresponding to frequency variations of the carrier waves, means for deriving said first modulation from across said differentially connected resistors, and additional means connected to the anode end of one of said pair of resistors for deriving a second modulation voltage corresponding to amplitude variations of applied carrier waves.

7. In combination with a first diode having a modulated carrier wave input circuit, a pair of resistors arranged in series relation between the anode and cathode of the diode, a second diode utilizing said modulated carrier wave input circuit, a piezo-electrical crystal, tuned to the frequency of the said input circuit, coupling said input circuit to said diodes, a second pair of resistors arranged in series relation between the anode and cathode of the second diode, means applying to said input circuit modulated carrier waves which are alternatively frequency or amplitude modulated, means establishing the cathode end of one of said pair of resistors at ground potential, means connecting in series relation between the cathodes of said diodes like resistors of said two pair of resistors, means for connecting a detected frequency modulation voltage output terminal to the ungrounded cathode end of said pair of like resistors, and a separate detected amplitude modulation voltage terminal connected to the anode end of one of said pair of resistors.

8. In combination, a first diode having a frequency and amplitude modulated carrier wave input circuit, a pair of resistor elements arranged in series relation between the cathode of said diode and one side of said input circuit, a second diode provided with a modulated carrier wave input circuit, a second pair of resistors arranged in series relation between the cathode of the second diode and one side of its input circuit, a connection between the junction of said first pair of resistors and said second pair of resistors, like resistors of said two pairs of resistors being differentially connected to provide thereacross modulation voltage corresponding to frequency variations of the modulated carrier waves, means including a push-pull amplifier for deriving said modulation from across said differentially connected resistors, and additional means, connected to the anode end of one of said pair of resistors, for applying modulation voltage corresponding to amplitude variation of said modulated waves to said amplifier.

9. In combination with a first diode having a modulated carrier wave input circuit and a pair of resistors arranged in series relation between the anode and cathode of the diode, a second diode, means coupling the second diode to said modulated carrier wave input circuit, a second pair of resistors arranged in series relation between the anode and cathode of the second diode, means applying to said input circuit modulated carrier waves, means establishing the cathode end of one of said pair of resistors at relatively invariable potential, means connecting in series relation between the cathodes of said diodes like resistors of said two pair of resistors, means for connecting an output terminal for frequency variable modulation to the ungrounded cathode end of said pair of like resistors, and a separate amplitude modulation output terminal connected to the anode end of one of said pair of resistors.

10. In combination with a first diode having a modulated carrier wave input circuit and a pair of resistors arranged in series relation between the anode and cathode of the diode, a second diode having a modulated carrier wave input circuit, and a second pair of resistors arranged in series relation between the anode and cathode of the second diode, means applying to said input circuits modulated carrier waves, means connecting in series relation between the cathodes of said diodes like resistors of said two pair of resistors, means grounding the junction of said like resistors, means for connecting detected frequency modulation voltage output terminals to the ungrounded cathode ends of said pair of like resistors, separate detected amplitude modulation voltage output terminals connected to the anode end of one of said pair of resistors, and a push-pull amplifier having input terminals adapted to be connected to either of said output terminals.

11. In a detector of signal-modulated carrier energy, a frequency-responsive network comprising two circuits having frequency-response characteristics of the same type but sloping in opposite senses with frequency over a predetermined range of frequency deviation of a carrier signal applied thereto, a pair of rectifiers individually coupled to said circuits, a load impedance in circuit with one of the two circuits and one rectifier, a second separate load impedance in circuit with the second circuit and the second rectifier, fractional portions of said impedances being in series relation, and means for separately deriving from different points of said load impedances difference and summation components respectively of separately rectified outputs of said rectifiers.

12. In combination with a source of signals, a pair of detectors each having a respective input circuit coupled to said source, a respective output resistor operatively associated with each detector, means for joining a point on one resistor to a point on the other resistor, said points being located so as to divide each output resistor into first and second sections, connections for deriving from across the first section of one output resistor and the second section of the second output resistor in series aiding relation the additive combination of the detected voltages developed thereacross, and separate connections for deriving from across each of the second sections of the two output resistors in series-opposing relation the differential combination of the detected voltages developed thereacross.

13. In a balanced frequency modulation detecting system, a pair of detectors each provided with its respective output resistor, means joining the midpoints of said resistors thereby to divide each output resistor into respective first and second sections, connections to derive detected frequency modulation signal voltage from the differential of the detected voltages developed across the respective second resistor sections of said output resistors in series-opposition, and connections to derive detected amplitude modulated signal voltage from the addition of the detected voltages developed across the first section of one output resistor and the second section of the second output resistor in series-aiding relation.

MURRAY G. CROSBY.